US012627268B2

(12) United States Patent
    Xu et al.

(10) Patent No.:     US 12,627,268 B2
(45) Date of Patent:          May 12, 2026

(54) POWER AMPLIFIER CHIP AND COMMUNICATION DEVICE

(71) Applicant: HUAWEI TECHNOLOGIES CO., LTD., Shenzhen (CN)

(72) Inventors: Wei Xu, Shanghai (CN); Po Shi, Shanghai (CN); Zhengde Yang, Shanghai (CN); Yufeng Wang, Shenzhen (CN); Junhao Zou, Shanghai (CN); Qingquan Luo, Shanghai (CN); Shengchang Shangguan, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 627 days.

(21) Appl. No.: 18/169,516

(22) Filed: Feb. 15, 2023

(65) Prior Publication Data

US 2023/0188104 A1      Jun. 15, 2023

Related U.S. Application Data

(63) Continuation      of      application      No. PCT/CN2020/109769, filed on Aug. 18, 2020.

(51) Int. Cl.
*H03F 3/195*          (2006.01)
*H03F 3/24*            (2006.01)

(52) U.S. Cl.
CPC ....... *H03F 3/245* (2013.01); *H03F 2200/102* (2013.01); *H03F 2200/231* (2013.01); *H03F 2200/451* (2013.01)

(58) Field of Classification Search
CPC .................................. H03F 3/195; H03F 1/02
USPC ...................................... 330/307, 124 R, 295
See application file for complete search history.

(56) References Cited

U.S. PATENT DOCUMENTS

| | | |
|---|---|---|
| 10,027,287 B1 | 7/2018 | Ichitsubo et al. |
| 2017/0105184 A1 | 4/2017 | Kim et al. |

FOREIGN PATENT DOCUMENTS

| | | |
|---|---|---|
| CN | 1442902 A | 9/2003 |
| CN | 210403716 U | 4/2020 |

OTHER PUBLICATIONS

3GPP TS 38.101-3 V16.4.0, "3rd Generation Partnership Project; Technical Specification Group Radio Access Network; NR; User Equipment (UE) radio transmission and reception; Part 3: Range 1 and Range 2 Interworking operation with other radios (Release 16)," Jun. 2020, 487 pages.

(Continued)

*Primary Examiner* — Henry Choe
(74) *Attorney, Agent, or Firm* — Fish & Richardson P.C.

(57)          ABSTRACT

Example power amplifier chips and communication devices are described. One example power amplifier chip includes a package housing and a plurality of power amplifier dies. The plurality of power amplifier dies are packaged in the package housing, and each of the plurality of power amplifier dies includes at least one stage of power amplifier.

19 Claims, 11 Drawing Sheets

(56)  References Cited

OTHER PUBLICATIONS

3GPP TS 38.213 V16.2.0, "3rd Generation Partnership Project; Technical Specification Group Radio Access Network; NR; Physical layer procedures for control (Release 16)," Jun. 2020, 176 pages.

3GPP TS 36.213 V16.2.0, "3rd Generation Partnership Project; Technical Specification Group Radio Access Network; Evolved Universal Terrestrial Radio Access (E-UTRA); Physical layer procedures (Release 16)," Jun. 2020, 576 pages.

International Search Report and Written Opinion in International Appln. No. PCT/CN2020/109769, mailed on Jun. 1, 2021, 13 pages (with English translation).

POWER AMPLIFIER CHIP AND COMMUNICATION DEVICE

CROSS-REFERENCE TO RELATED APPLICATIONS

This application is a continuation of International Application No. PCT/CN2020/109769, filed on Aug. 18, 2020, the disclosure of which is hereby incorporated by reference in its entirety.

TECHNICAL FIELD

Embodiments of this application relate to the communication field, and in particular, to a power amplifier chip and a communication device.

BACKGROUND

With development of science and technologies, communication technologies have been improved rapidly. Wireless communication technologies have undergone long-term evolution and development. In a current wireless communication technology, to increase an information transmission rate, a terminal device usually supports simultaneous access to a 4G network and a 5G network in a dual-connectivity mode. A base station in the 4G network or the 5G network may perform data transmission with the terminal device by using a 4G frequency band or a 5G frequency band respectively.

In a related communication technology, two independent radio frequency units usually need to be disposed in the terminal device, to support data transmission in the 4G network and the 5G network respectively. Each radio frequency unit includes a power amplifier module, a power supply module, and the like. The two independent radio frequency units usually occupy a large layout area of the terminal device. This is not conducive to development of the terminal device toward a small size and a high degree of integration. In another possible dual-connectivity communication scenario, for example, a multi-SIM multi-standby or multi-mode simultaneous transmission scenario, a plurality of independent radio frequency units also cause a similar problem. Therefore, how to reduce a layout area occupied by a radio frequency unit in a terminal device supporting a dual-connectivity data transmission mode becomes an issue that needs to be addressed.

SUMMARY

This application provides a power amplifier chip and a communication device, to reduce a layout area occupied by a communication device in an electronic device. To achieve the foregoing objective, the following technical solutions are used in this application.

According to a first aspect, an embodiment of this application provides a power amplifier chip, including: a package housing; and a plurality of power amplifier dies, where the plurality of power amplifier dies are packaged in the package housing, and each of the plurality of power amplifier dies includes at least one stage of power amplifier.

In this embodiment of this application, the plurality of power amplifier dies are packaged in one package housing, so that a layout area occupied by the power amplifier in a terminal device can be reduced, thereby facilitating implementation of a highly integrated terminal device.

Based on the first aspect, in a possible implementation, the plurality of power amplifier dies respectively support different radio frequency bands.

The different radio frequency bands may include but are not limited to an N41 frequency band (2496 MHz to 2690 MHz), a B39 frequency band (1880 MHz to 1920 MHz), or a B1 frequency band (1920 MHz to 1980 MHz).

Based on the first aspect, in a possible implementation, the power amplifier chip further includes: a first switch, located in the package housing, and configured to connect or disconnect a first capacitor between a common ground and a power terminal of a first power amplifier die of the plurality of power amplifier dies.

Based on the first aspect, in a possible implementation, the power amplifier chip further includes: a second capacitor and a second switch, located in the package housing, where the second switch is configured to connect or disconnect the second capacitor between the common ground and a power terminal of a second power amplifier die of the plurality of power amplifier dies.

Optionally, the second power amplifier die may be the first power amplifier die. Alternatively, the second power amplifier die may be a power amplifier die different from the first power amplifier die.

The first switch, the second capacitor, and the second switch are packaged in the power amplifier chip, so that a layout area occupied by a communication device in a terminal device can be further reduced in a scenario in which a power amplifier has a plurality of power supply modes.

Based on the first aspect, in a possible implementation, the power amplifier chip further includes: a controller, located in the package housing, where the controller is configured to receive, from a radio frequency integrated circuit, indication information used to indicate a power amplifier configuration, control, based on the indication information, at least one stage of power amplifier in at least one of the plurality of power amplifier dies to be enabled, and adjust a gain of the at least one stage of enabled power amplifier, where the indication information includes at least one of the following: the at least one stage of enabled power amplifier, a gain of the power amplifier, a power supply mode of the power amplifier, a moment at which the power amplifier is started, a moment at which the gain of the power amplifier is adjusted, or an output port in use of the power amplifier chip.

Based on the first aspect, in a possible implementation, the power amplifier chip further includes: a plurality of switch groups, located in the package housing, where a first switch group of the plurality of switch groups includes a first input terminal and a plurality of output terminals, an output terminal of a third power amplifier die of the plurality of power amplifier dies is connected to a first input terminal of at least one first switch group of the plurality of first switch groups, and a plurality of output terminals of each of the at least one first switch group are correspondingly connected to at least a part of a plurality of output ports of the power amplifier chip.

Optionally, the third power amplifier die may be the first power amplifier die, or may be the second power amplifier die.

Based on the first aspect, in a possible implementation, a second switch group of the at least one first switch group includes a second input terminal, the second input terminal is connected to a radio frequency signal receive terminal of the power amplifier chip, and a switch in the second switch group connects the radio frequency signal receive terminal to one of a plurality of output terminals in the second switch group based on a control signal.

Based on the first aspect, in a possible implementation, a first power amplifier integrated in the second power amplifier die of the plurality of power amplifier dies includes a first gain and a second gain, where a first time period between a moment at which the first power amplifier is started and a moment at which the first power amplifier starts to transmit a signal is longer than a second time period between a moment at which the first power amplifier starts to be adjusted from the first gain to the second gain and a moment at which the first power amplifier starts to transmit a signal by using the second gain.

According to a second aspect, an embodiment of this application provides a communication device. The communication device may include a power supply device and the power amplifier chip according to the first aspect, where a first power supply device of the power supply device is configured to supply power to a first power amplifier die in the power amplifier chip, and a second power supply device of the power supply device is configured to supply power to a remaining power amplifier die in the power amplifier chip.

Based on the second aspect, in a possible implementation, the communication device further includes: a radio frequency integrated circuit, configured to transmit a radio frequency signal to a power amplifier integrated in at least one of a plurality of power amplifier dies.

Based on the second aspect, in a possible implementation, the power supply device is further configured to: receive an indication signal from the radio frequency integrated circuit, and supply power to the power amplifier based on the indication signal in a power supply mode indicated by the indication signal, where the power supply mode includes an average power tracker mode or an envelope tracker mode.

Based on the second aspect, in a possible implementation, the communication device further includes: a first capacitor, where the first capacitor is connected or disconnected between a common ground and a power terminal of the first power amplifier die based on control of a first switch.

Based on the second aspect, in a possible implementation, the radio frequency integrated circuit is further configured to: transmit indication information to the controller in the power amplifier chip.

BRIEF DESCRIPTION OF DRAWINGS

To describe the technical solutions in embodiments of this application more clearly, the following briefly describes the accompanying drawings for describing embodiments of this application. It is clear that the accompanying drawings in the following description show merely some embodiments of this application, and a person of ordinary skill in the art may still derive other drawings from these accompanying drawings without creative efforts.

DESCRIPTION OF EMBODIMENTS

Figure 1:
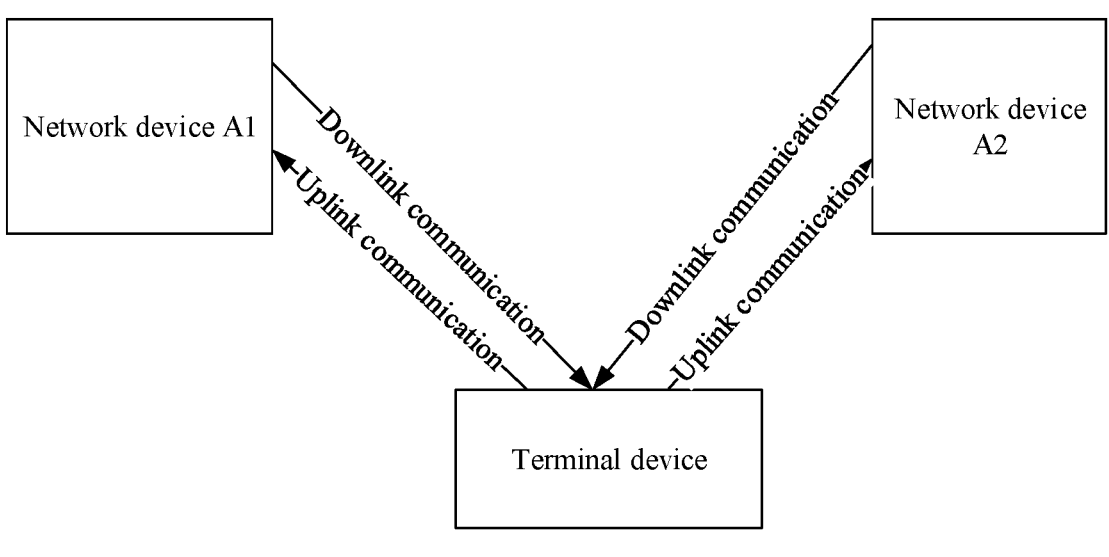
FIG. 1 is a schematic diagram of an application scenario according to an embodiment of this application.

The following clearly describes the technical solutions in embodiments of this application with reference to the accompanying drawings in embodiments of this application. It is clear that the described embodiments are some but not all of embodiments of this application. All other embodiments obtained by a person of ordinary skill in the art based on embodiments of this application without creative efforts shall fall within the protection scope of this application.

In this application, terms such as "first" and "second" are merely intended for a purpose of differentiated description, and should not be construed as an indication or an implication of relative importance or an indication or an implication of a sequence. In addition, terms "comprise", "include", and any variants thereof are intended to cover a non-exclusive inclusion. For example, a series of steps or units are included. A method, a system, a product, or a device is not necessarily limited to clearly listed steps or units, but may include other steps or units that are not clearly listed and that are inherent to the process, the method, the product, or the device. In descriptions of embodiments of this application, the word "example", "for example", or the like is used to represent giving an example, an illustration, or a description. Any embodiment or design scheme described as an "example" or "for example" in embodiments of this application should not be explained as being more preferred or having more advantages than another embodiment or design scheme. Exactly, use of the word "example", "for example", or the like is intended to present a related concept in a specific manner.

In embodiments of this application, a terminal device may also be referred to as user equipment (UE), a mobile station (MS), a mobile terminal (MT), an access terminal, a subscriber unit, a subscriber station, a mobile console, a remote station, a remote terminal, a mobile device, a user terminal, a terminal, a wireless communication device, a user agent, a user apparatus, or the like. The terminal device may be a device that provides voice/data connectivity for a user, for example, a handheld device or a vehicle-mounted device that has a wireless connection function. Currently, some examples of the terminal are a mobile phone, a tablet computer, a notebook computer, a palmtop computer, a mobile internet device (MID), a wearable device, a virtual reality (VR) device, an augmented reality (AR) device, a wireless terminal in industrial control, a wireless terminal in self driving, a wireless terminal in a remote medical surgery, a wireless terminal in a smart grid, a wireless terminal in transportation safety, a wireless terminal in a smart city, a wireless terminal in a smart home, a cellular phone, a cordless phone, a session initiation protocol (SIP) phone, a wireless local loop (WLL) station, a personal digital assistant (PDA), a handheld device with a wireless communication function, a computing device or another processing device connected to a wireless modem, a vehicle-mounted device, a wearable device, a terminal device in a future 5G network, or a terminal device in a future evolved public land mobile network (PLMN). This is not limited in embodiments of this application.

In embodiments of this application, a network device may be a device configured to communicate with a terminal device. The network device may also be referred to as an access network device or a radio access network device, and may be an evolved NodeB (eNB or eNodeB) in an LTE system, or may be a radio controller in a cloud radio access network (CRAN) scenario. Alternatively, the access device may be a relay station, an access point, a vehicle-mounted device, a wearable device, an access device in a future 5G network, an access device in a future evolved PLMN network, or the like, or may be an access point (AP) in a WLAN, or may be a gNB in a new radio (NR) system. This is not limited in embodiments of this application. Alternatively, in embodiments of this application, the network device may be a device in a RAN (radio access network), in other words, a RAN node that connects a terminal device to a wireless network. For example, as an example rather than a limitation, the network device may include a gNB, a transmission reception point (TRP), an evolved NodeB (eNB), a radio network controller (RNC), a NodeB (NB), a base station controller (BSC), a base transceiver station (BTS), a home base station (for example, a home evolved NodeB or a home NodeB, HNB), a baseband unit (BBU), or a wireless fidelity (Wi-Fi) access point (AP).

FIG. 1 is a schematic diagram of a scenario to which an embodiment of this application is applied. The scenario shown in FIG. 1 includes a terminal device, a network device A1, and a network device A2. The terminal device may simultaneously access the network device A1 and the network device A2. This access mode is referred to as dual-connectivity (DC). In an example scenario, one of the two network devices that is responsible for exchanging a radio resource control message with the terminal device and responsible for interacting with a core network control plane entity may be referred to as a primary network device, and the other network device is a secondary network device. Similarly, alternatively, the terminal device may simultaneously have communication connections to a plurality of network devices and may send and receive data. This may be referred to as multi-connectivity (MC). One of the plurality of network devices may be responsible for exchanging a radio resource control message with the terminal device and responsible for interacting with a core network control plane entity. In this case, the network device may be referred to as a primary network device, and a remaining network device may be referred to as a secondary network device. In the following embodiments of this application, dual-connectivity is used as an example for detailed description.

In the scenario shown in FIG. 1, the network device A1 and the network device A2 may be network devices of a same radio access type. For example, the network device A1 and the network device A2 may be network devices in an LTE system, or may be network devices in an NR system. Alternatively, the network device A1 and the network device A2 may be network devices of different radio access types. During specific implementation, the network device A1 may be a network device in an LTE system, and the network device A2 may be a network device in an NR system. Both the network device A1 and the network device A2 may serve as primary network devices. Further, the network device A1 and the network device A2 may separately serve the terminal device by using different radio frequency bands.

A communication device may be disposed in the terminal device. The terminal device may send data to the network device A1 and the network device A2 by using the communication device, or receive data from the network device A1 and the network device A2 by using the communication device. The communication device usually includes a power amplifier (PA), a power supply device that provides electric energy for a power amplifier, an RFIC (radio frequency integrated circuit) configured to provide a radio frequency signal for the PA, and the like, or may optionally include a modem, an antenna, and the like.

When the terminal device performs data transmission with network devices through dual-connectivity or multi-connectivity, two or more power amplifiers need to be disposed to perform multi-channel data transmission. For example, when dual-connectivity is used, two power amplifiers are disposed, so that the terminal device separately performs data transmission with the network device A1 and the network device A2; or when triple-connectivity is used, three power amplifiers are disposed, so that the terminal device performs data transmission with corresponding network devices. In addition, to improve operating performance of a power amplifier corresponding to each connection channel in the communication device, a plurality of independent power supply modules usually need to be disposed, to independently supply power to each power amplifier. As a result, the communication device usually occupies an excessively large layout area in the terminal device. This is not conducive to implementation of a highly integrated terminal device.

Based on the application scenario shown in FIG. 1, a structure of a communication device in a terminal device is described below in detail by using embodiments shown in FIG. 2 to FIG. 8, to address a technical issue of reducing a layout area.

The communication device may include one or more power amplifier chips. Each power amplifier chip may be integrated with at least two power amplifiers. To be specific, one power amplifier chip may be integrated with two power amplifiers, three power amplifiers, four power amplifiers, or the like. This is not limited in embodiments of this application. An internal structure of a power amplifier chip is described in detail with reference to FIG. 2 by using an example in which one power amplifier chip includes two power amplifiers.

Figure 2:
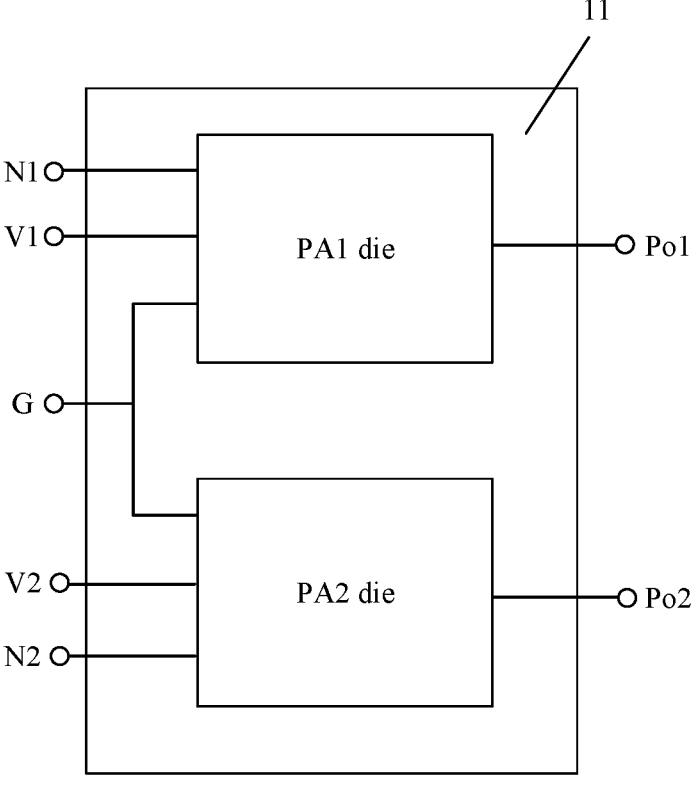
FIG. 2 is a schematic diagram of a structure of a power amplifier chip according to an embodiment of this application.

In FIG. 2, a power amplifier chip 11 may include a PA1 die and a PA2 die. The die herein may also be referred to as a die, that is, an integrated circuit formed on a semiconductor by using a process such as growing, doping, etching, or developing. The integrated circuit has a power amplification function. In specific practice, the PA1 die and the PA2 die may be jointly disposed in a packaging material by using a process such as bonding or sintering. The packaging material is configured to form a package housing. Then, lead-out terminals of the PA1 die and the PA2 die are connected, by using a process such as jumpers or embedded wires, to pins of the package housing that are configured to connect to external components, so that the PA1 die and the PA2 die can exchange signals with external components or devices.

In the power amplifier chip 11, the package housing is configured to package internal components. For example, this may be implemented by using a standard packaging process. The packaged internal components include but are not limited to the plurality of dies described above and other necessary components, for example, a switch, a switch group, a capacitor, or a controller mentioned in subsequent embodiments. For details, refer to descriptions of subsequent embodiments.

A power amplifier PA1 integrated in the PA1 die and a power amplifier PA2 integrated in the PA2 die may be configured to support power amplification for signals at different frequency bands. Specifically, the PA1 may support power amplification at an N41 frequency band (2496 MHz to 2690 MHz), and the PA2 may support power amplification at a B39 frequency band (1880 MHz to 1920 MHz), a B3 frequency band (1710 MHz to 1785 MHz), or a B1 frequency band (1920 MHz to 1980 MHz).

It can be learned from FIG. 2 that the power amplifier chip 11 includes a plurality of pins. The plurality of pins are a signal input terminal N1 of the PA1, a signal input terminal N2 of the PA2, a power terminal V1 of the PA1, a power terminal V2 of the PA2, a common ground terminal G of the PA1 and the PA2, an output port Po1 of the PA1, and an output port Po2 of the PA2. The plurality of pins are respectively connected to external devices or components such as a power supply device, an RFIC, or an antenna device, to implement power amplification for a plurality of uplink communication signals shown in FIG. 1.

In this embodiment of this application, a plurality of power amplifier dies are packaged in one power amplifier chip, so that a layout area occupied by a power amplifier in a terminal device can be reduced, thereby facilitating implementation of a highly integrated terminal device.

Figure 3:
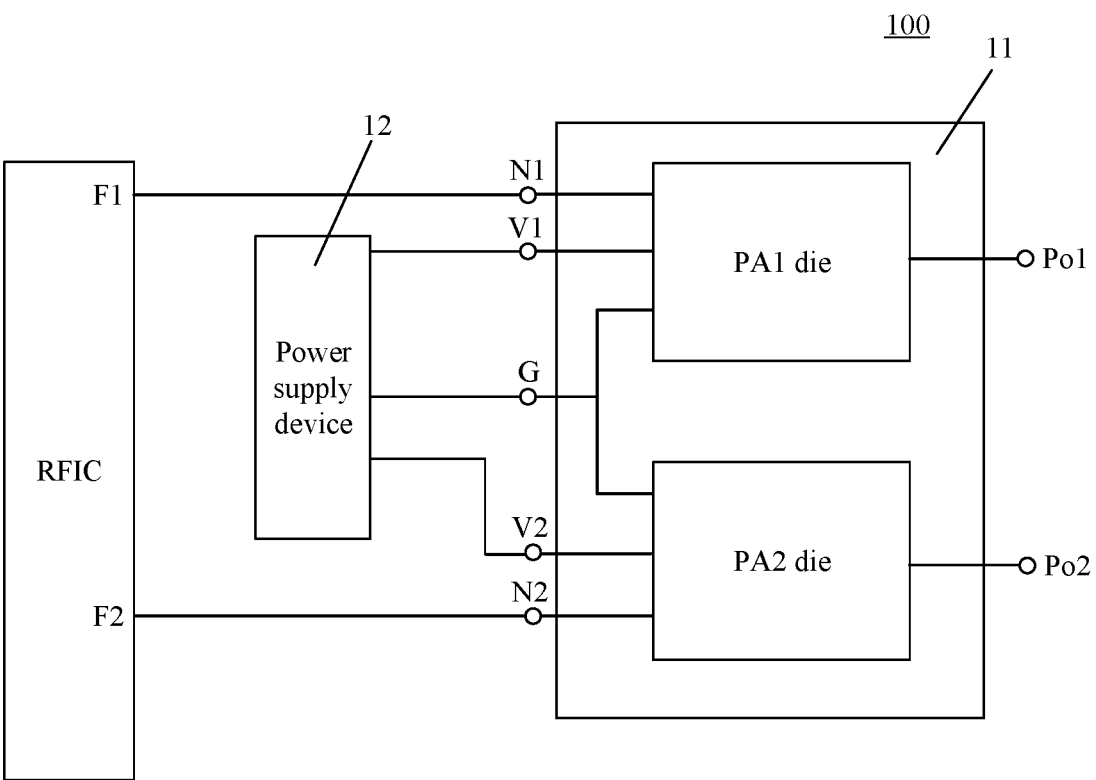
FIG. 3 is a schematic diagram of a structure of a communication device according to an embodiment of this application.

Based on the power amplifier chip 11 shown in FIG. 2, an embodiment of this application provides a communication device 100 shown in FIG. 3. The communication device 100 includes an RFIC, a power supply device 12, and the power amplifier chip 11.

The power supply device 12 may include two output terminals and one common ground terminal. One output terminal is connected to the power terminal V1 of the power amplifier chip, to supply power to the PA1 in the power amplifier chip 11. The other output terminal is connected to the power terminal V2 of the power amplifier chip 11, to supply power to the power amplifier PA2 in the power amplifier chip. The common ground terminal is connected to the common ground terminal G of the power amplifier chip 11.

Figure 4:
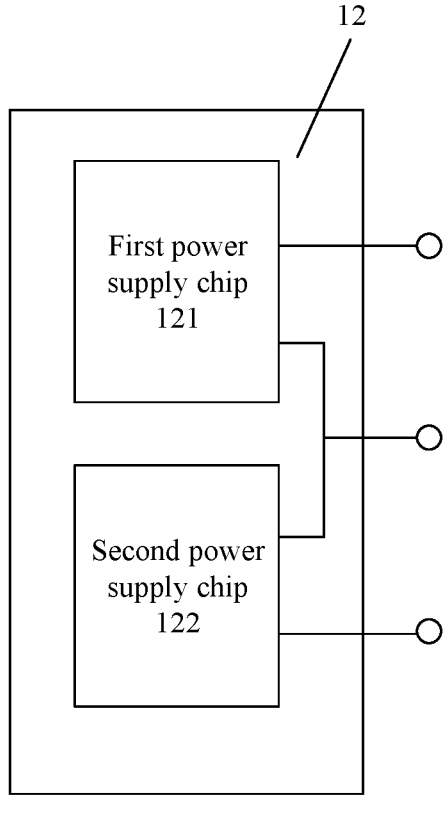
FIG. 4 is a schematic diagram of an internal structure of a power supply device according to an embodiment of this application.

In a possible implementation, the power supply device 12 may include a first power supply chip 121 and a second power supply chip 122, as shown in FIG. 4. The first power supply chip 121 and the second power supply chip 122 may be independent dies packaged in the power supply device 12. The first power supply chip 121 supplies power to the PA1, and the second power supply chip 122 supplies power to the PA2.

A first radio frequency signal output terminal F1 of the RFIC is connected to the signal input terminal N1 of the power amplifier chip 11. A second radio frequency signal output terminal F2 of the RFIC is connected to the signal input terminal N2 of the power amplifier chip 11. The first radio frequency signal output terminal F1 and the second radio frequency signal output terminal F2 of the RFIC are configured to provide a signal at a first frequency band and a signal at a second frequency band respectively. The signal at the first frequency band may be a signal at the N41 frequency band, and the signal at the second frequency band may be a signal at the B39 frequency band, the B1 frequency band, or the B3 frequency band.

In this embodiment of this application, each of the plurality of power amplifier dies included in the power amplifier chip may be further integrated with a plurality of cascaded PAs. The plurality of cascaded PAs may be integrated in one die by using processes such as growing, ion doping, etching, and developing on one silicon substrate. A PA configured to receive a signal input by an external device (for example, an RFIC) is referred to as a previous-stage PA. A PA configured to output a signal to an external device (for example, an antenna) is referred to as a next-stage PA. In addition, in some scenarios, one or more stages of intermediate-stage PAs may be further disposed between the previous-stage PA and the next-stage PA. Each stage of PA requires power supply during operation. A power supply voltage of the previous-stage PA may be a constant direct current voltage. The next-stage PA supports a plurality of power supply modes. For example, the plurality of power supply modes may include but are not limited to an APT (average power tracker) mode and an ET (envelope tracker) mode. A power supply mode of an intermediate-stage PA may be a constant direct current voltage mode, an APT mode, or an ET mode according to a requirement in a scenario. In the APT mode, to improve linearity of a carrier at a high bandwidth, a capacitor is further disposed between a power terminal of a power amplifier and a common ground. However, in the ET mode, a power supply voltage changes quickly, and therefore a capacitor affects an envelope tracker feature. In this case, no capacitor needs to be disposed in the ET mode. The power amplifier chip is described below in detail with reference to FIG. 5 by using an example in which each power amplifier die is integrated with two stages of cascaded PAs.

Figure 5:
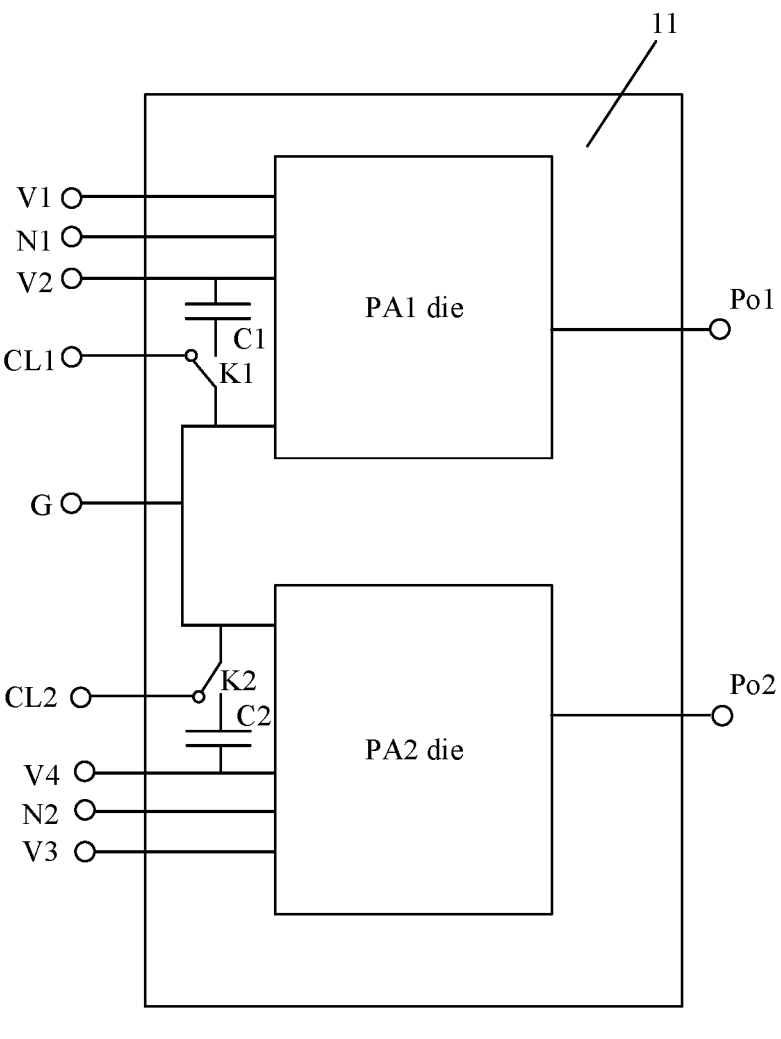
FIG. 5 is a schematic diagram of another structure of a power amplifier chip according to an embodiment of this application.

Further, FIG. 5 is a schematic diagram of another structure of a power amplifier chip according to an embodiment of this application. In FIG. 5, the power amplifier chip 11 includes two PA dies: a PA1 die and a PA2 die. The PA1 die is integrated with two cascaded PAs, and the PA2 die is also integrated with two cascaded PAs. After the power amplifier chip 11 is packaged, from an external angle of view, pins of the power amplifier chip 11 include a first power terminal V1, a second power terminal V2, a third power terminal V3, a fourth power terminal V4, a signal input terminal N1, a signal input terminal N2, an output port Po1, an output port Po2, and a common ground terminal G. Similar to the power amplifier chip 11 shown in FIG. 2, corresponding terminals of the PA1 die and the PA2 die are respectively connected to the pins of the power amplifier chip 11 by using jumpers or embedded wires. A connection relationship is not described in detail herein. The signal input terminal N1 is configured to provide, for a previous-stage PA in the PA1, a signal at a first frequency band that is input by an RFIC. The output port Po1 is configured to provide, for an antenna, a signal output by a next-stage PA in the PA1. The signal input terminal N2 is configured to provide, for a previous-stage PA in the PA2, a signal at a second frequency band that is input by the RFIC. The output port Po2 is configured to provide, for the antenna, a signal output by a next-stage PA in the PA2. The first power terminal V1 is configured to provide, for the previous-stage PA in the PA1, a constant direct current voltage that is input from an external environment. The second power terminal V2 is configured to provide, for the next-stage PA in the PA1, a APT-mode voltage or an ET-mode voltage that is input from an external environment. The third power terminal V3 is configured to provide, for the previous-stage PA in the PA2, a constant direct current voltage that is input from an external environment. The fourth power terminal V4 is configured to provide, for the next-stage PA in the PA2, a APT-mode voltage or an ET-mode voltage that is input from an external environment. The common ground terminal G is configured to provide, for all stages of PAs in the PA1 and all stages of PAs in the PA2, a common reference voltage signal that is provided by an external environment.

Further, in FIG. 5, a capacitor C1, a capacitor C2, a switch K1, and a switch K2 are further packaged in the power amplifier chip 11. External pins of the power amplifier chip 11 further include a control terminal CL1 and a control terminal CL2. A first electrode of the capacitor C1 is connected to the second power terminal V2. A second electrode of the capacitor C1 is connected to one terminal of the switch K1. The other terminal of the switch K1 is connected to the common ground G. A control terminal of the switch K1 is connected to the control terminal CL1. A first electrode of the capacitor C2 is connected to the fourth power terminal V4. A second electrode of the capacitor C2 is connected to one terminal of the switch K2. The other terminal of the switch K2 is connected to the common ground G. A control terminal of the switch K2 is connected to the control terminal CL2. It should be noted that, in an actual product, positions of the capacitor C1 and the switch K1 may be interchanged. Specifically, one terminal of the switch K1 is connected to the second power terminal V2, another terminal of the switch K1 is connected to a first electrode of the capacitor C1, and a second electrode of the capacitor C1 is connected to the common ground G. In addition, positions of the capacitor C2 and the switch K2 may also be interchanged. For a specific interchange manner, refer to related descriptions of the position interchange between the capacitor C1 and the switch K1. Details are not described herein again. The control terminal CL1 is configured to receive a control signal sent from an external environment, to control the switch K1 to be switched on or switched off. When the second power terminal V2 inputs an APT-mode voltage to the next-stage PA in the PA1, an external control signal controls, by using the control terminal CL1, the switch K1 to be switched on, and the capacitor C1 is connected to the common ground G. When the second power terminal V2 inputs an ET-mode voltage to the next-stage PA in the PA1, an external control signal controls, by using the control terminal CL1, the switch K1 to be switched off, and the capacitor C1 is disconnected from the common ground G. A principle of switching on and switching off the switch K2 is the same as that of the switch K1. Details are not described herein again. The switch K1 and the switch K2 may include but are not limited to a triode, a MOS transistor, or the like. When the switch K1 and the switch K2 are MOS transistors, the control terminals of the switch K1 and the switch K2 are gates, and the other two electrodes of the switch K1 and the switch K2 are respectively sources and drains. Whether a terminal is specifically a source or a drain is determined based on whether a PMOS transistor or an NMOS transistor is used. It should be noted that the capacitor C1, the capacitor C2, the switch K1, and the switch K2 that are packaged in the power amplifier chip 11 are also dies. For example, these components may be located in one or more dies, or these components may be implemented by using discrete components. This is not limited in this embodiment.

In this embodiment of this application, the capacitor C1, the capacitor C2, the switch K1, and the switch K2 are packaged in the power amplifier chip 11, so that a layout area occupied by a communication device in a terminal device can be further reduced in a scenario in which a power amplifier has a plurality of power supply modes.

Figure 6:
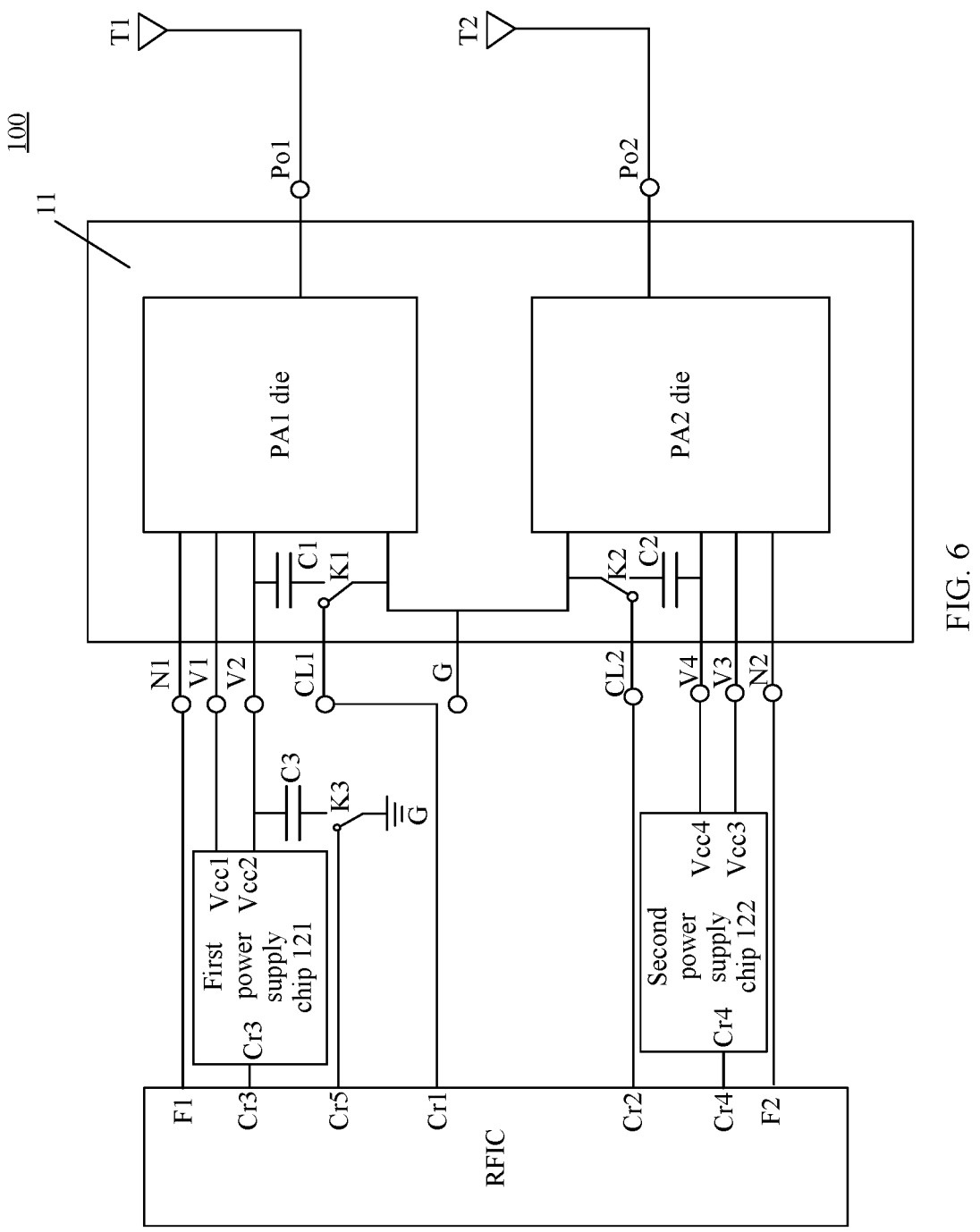
FIG. 6 is a schematic diagram of another structure of a communication device according to an embodiment of this application.

Based on the power amplifier chip 11 shown in FIG. 5, an embodiment of this application provides a communication device 100 shown in FIG. 6. The communication device 100 includes an RFIC, a first power supply chip 121, a second power supply chip 122, the power amplifier chip 11, an antenna device T1, and an antenna device T2.

The RFIC includes a first radio frequency signal output terminal F1, a second radio frequency signal output terminal F2, a first control signal output terminal Cr1, a second control signal output terminal Cr2, a third control signal output terminal Cr3, and a fourth control signal output terminal Cr4. The first radio frequency signal output terminal F1 of the RFIC is connected to the signal input terminal N1 of the power amplifier chip 11. The second radio frequency signal output terminal F2 of the RFIC is connected to the signal input terminal N2 of the power amplifier chip 11. The first control signal output terminal Cr1 of the RFIC is connected to the control terminal CL1 of the power amplifier chip 11. The second control signal output terminal Cr2 of the RFIC is connected to the control terminal CL2 of the power amplifier chip 11. The third control signal output terminal Cr3 of the RFIC is connected to a control terminal Cr3 of the first power supply chip 121. The fourth control signal output terminal Cr4 of the RFIC is connected to a control terminal Cr4 of the second power supply chip 122.

Figure 7:
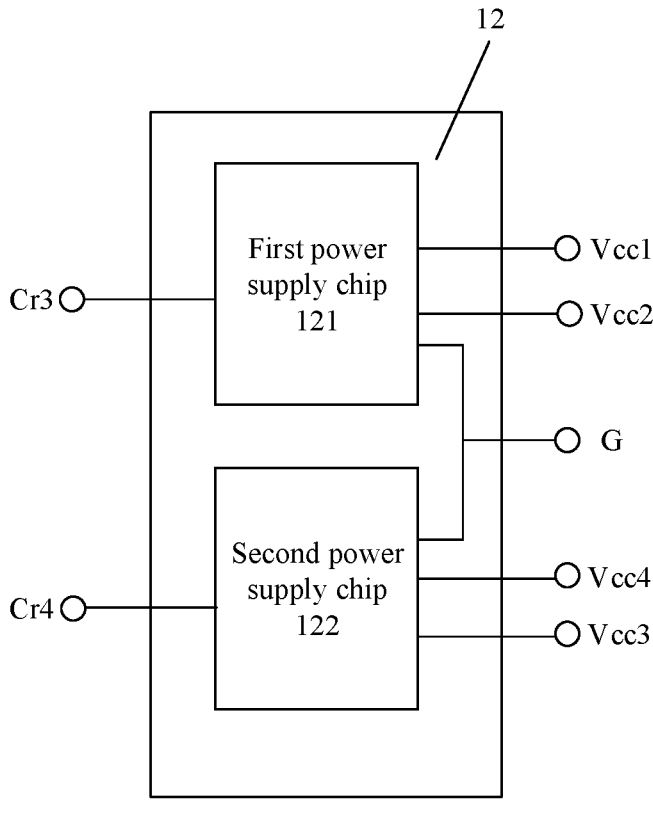
FIG. 7 is a schematic diagram of another structure of a power supply device according to an embodiment of this application.

An output terminal Vcc1 of the first power supply chip 121 is connected to the first power terminal V1 of the power amplifier chip 11. An output terminal Vcc2 of the first power supply chip 121 is connected to the second power terminal V2 of the power amplifier chip 11. An output terminal Vcc3 of the second power supply chip 122 is connected to the third power terminal V3 of the power amplifier chip 11. An output terminal Vcc4 of the second power supply chip is connected to the fourth power terminal V4 of the power amplifier chip 11. During specific implementation, the first power supply chip 121 and the second power supply chip 122 may be packaged in one power supply device 12, and are respectively connected to external chips or devices by using exposed pins or ports, to exchange signals, as shown in FIG. 7.

In addition, in the communication device shown in FIG. 6, to improve performance of a power amplifier configured to support the B41 frequency band and the like in an APT power supply mode, a capacitor C3 and a switch K3 usually need to be connected in series between the second output terminal Vcc2 of the first power supply chip 121 and the common ground G. A first electrode of the capacitor C3 is connected to the second output terminal Vcc2. A second electrode of the capacitor C3 is connected to one terminal of the switch K3. The other terminal of the switch K3 is connected to the common ground G. Alternatively, positions of the capacitor C3 and the switch K3 may be interchanged. For a specific interchange manner, refer to related descriptions of the position interchange between the capacitor C1 and the switch K1. Details are not described herein again. In addition, the RFIC further includes a fifth control signal output terminal Cr5, and a control terminal of the switch K3 is connected to the fifth control signal output terminal Cr5 of the RFIC.

Figure 8:
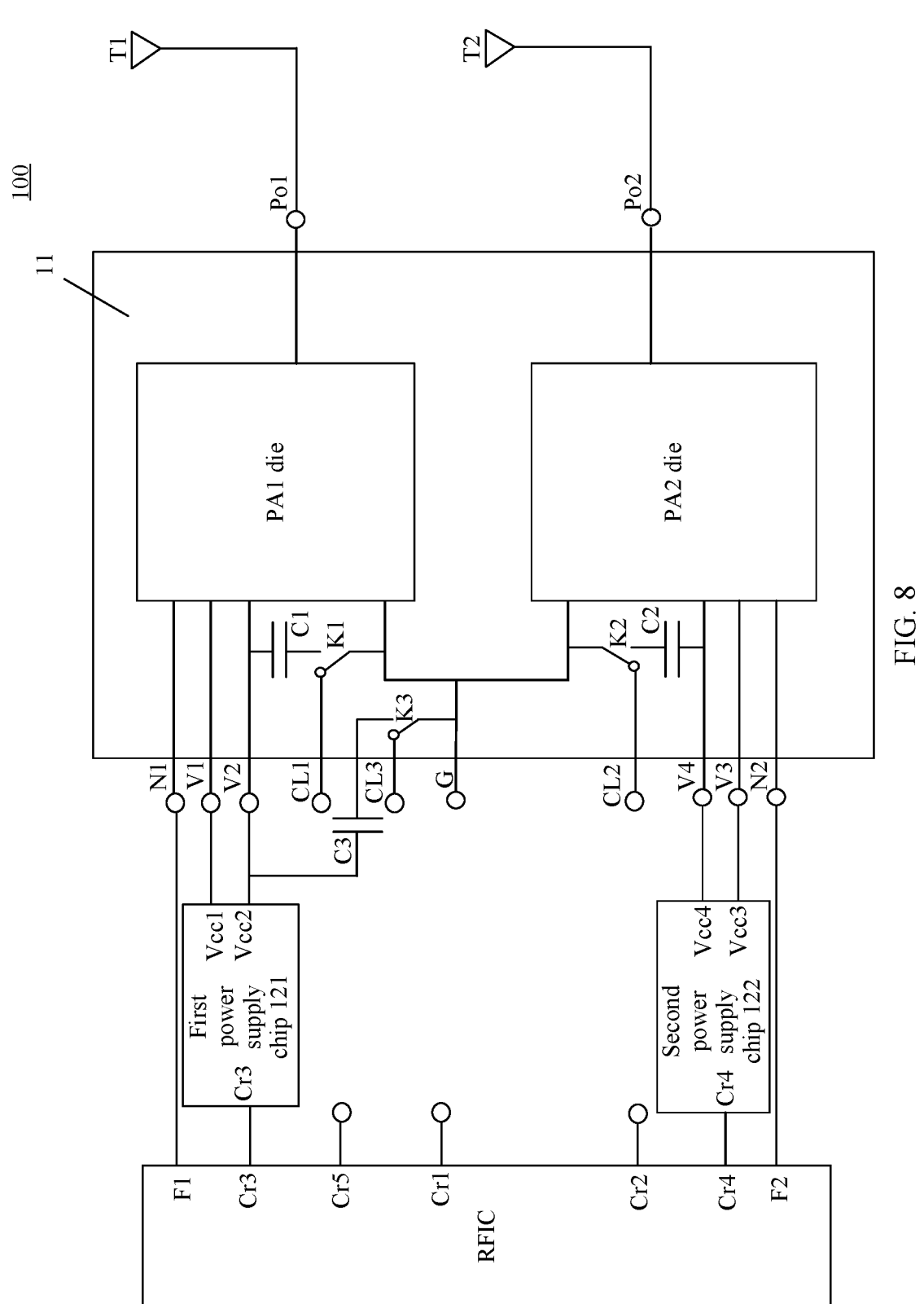
FIG. 8 is a schematic diagram of another structure of a communication device according to an embodiment of this application.

To further reduce a layout area occupied by the communication device in a terminal device, in a possible implementation, the switch K3 may be alternatively disposed in the power amplifier chip 11, as shown in FIG. 8. In this case, pins of the power amplifier chip 11 further include a control terminal CL3, to connect the control terminal of the switch K3 to the fifth control signal output terminal Cr5 of the RFIC through the control terminal CL3. For visibility of FIG. 8, a case in which the control terminal CL1, the control terminal CL2, and the control terminal CL3 are respectively connected to the first control signal output terminal Cr1, the second control signal output terminal Cr2, and the third control signal output terminal Cr3 is not shown in FIG. 8.

In addition, it should be noted that the first power supply chip 121, the second power supply chip 122, the power amplifier chip 11, and the RFIC each include a common ground terminal, and all the common ground terminals may be connected. In FIG. 6 and FIG. 8, a common ground terminal of a chip or a device other than the power amplifier chip 11 is not shown.

In the communication device shown in FIG. 6, in a scenario in which signals are sent in a dual-connectivity mode, the output terminal Vcc1 of the first power supply chip 121 provides a constant direct current voltage for the previous-stage PA in the PA1, and the output terminal Vcc3 of the second power supply chip 122 provides a constant direct current voltage for the previous-stage PA in the PA2. Based on a magnitude of a power of a to-be-transmitted radio frequency signal, the RFIC may control the output terminal Vcc2 of the first power supply chip 121 to supply power to the next-stage PA in the PA1 in an APT mode or an ET mode, or control the output terminal Vcc4 of the second power supply chip 122 to supply power to the next-stage PA in the PA2 in an APT mode or an ET mode. Specifically, when the RFIC detects that the to-be-transmitted radio frequency signal is a signal with a high power, the RFIC may control each of the first power supply chip 121 and the second power supply chip 122 to supply power in the APT mode. In this case, the RFIC may control the switch K1, the switch K2, and the switch K3 to be switched on, the capacitor C1 to be connected between the output terminal Vcc2 of the first power supply chip 121 and the common ground G, the capacitor C2 to be connected between the output terminal Vcc4 of the second power supply chip 122 and the common ground G, and the capacitor C3 to be connected between the output terminal Vcc2 of the first power supply chip 121 and the common ground G. When the RFIC detects that the to-be-transmitted radio frequency signal is a signal with a medium or low power, the RFIC may control each of the first power supply chip and the second power supply chip to supply power in the ET mode. In this case, the RFIC may control each of the switch K1, the switch K2, and the switch K3 to be switched off, and none of the capacitor C1, the capacitor C2, and the capacitor C3 is connected to the circuit in this case.

In the communication device shown in FIG. 6 or FIG. 8, a layout area occupied by the communication device can be reduced while independent power supply is ensured for each PA, thereby facilitating implementation of a highly integrated terminal device.

Figure 9:
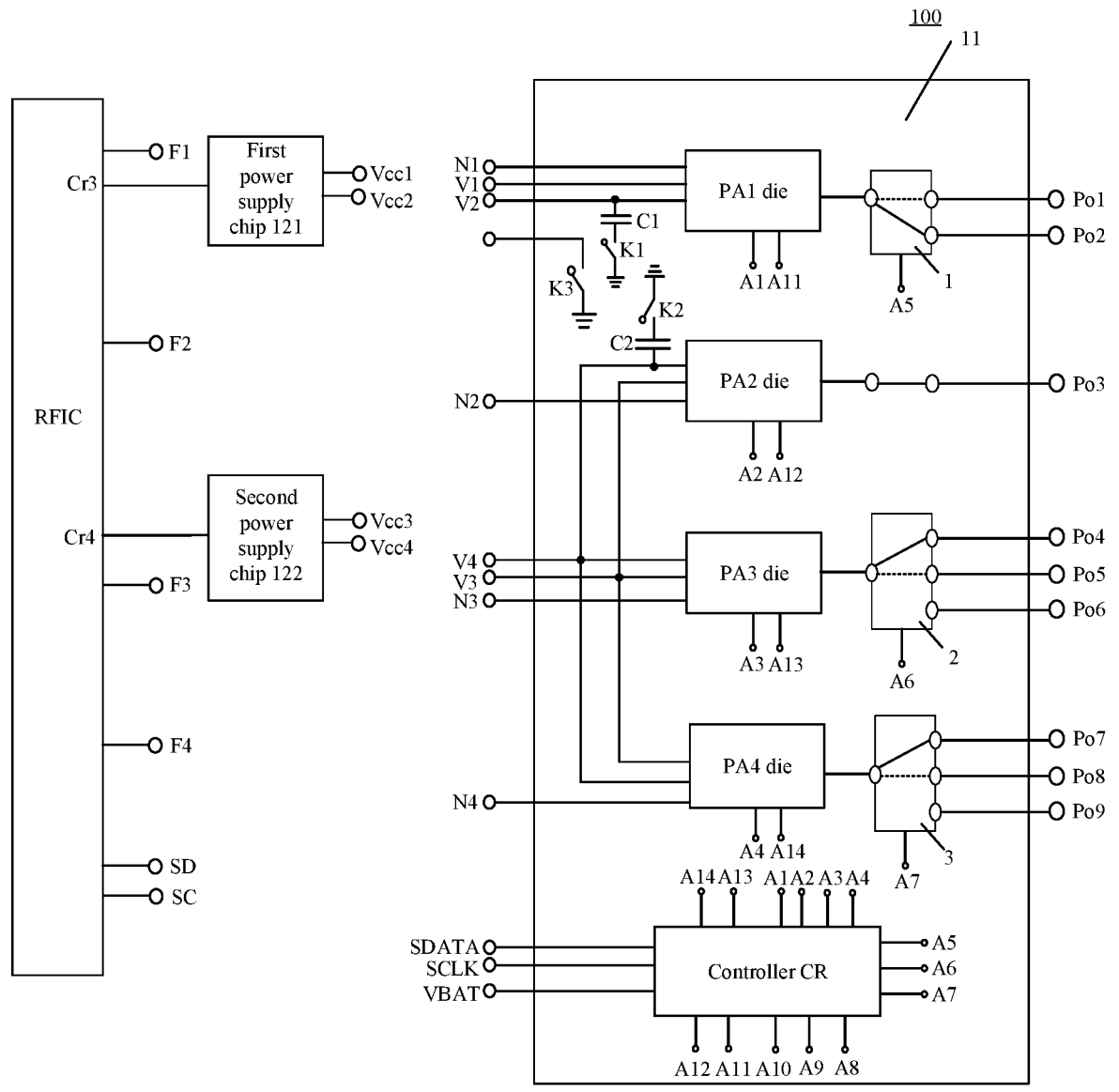
FIG. 9 is a schematic diagram of another structure of a communication device according to an embodiment of this application.

Further, FIG. 9 is a schematic diagram of another structure of an electronic device 100 according to an embodiment of this application. In FIG. 9, the electronic device 100 includes a first power supply chip 121, a second power supply chip 122, an RFIC, and a power amplifier chip 11. For a connection relationship and signal interaction between the RFIC and the first power supply chip 121, and a connection relationship and signal interaction between the RFIC and the second power supply chip 122, refer to related descriptions in the embodiment shown in FIG. 6. Details are not described herein again.

The power amplifier chip 11 includes four PA dies: a PA1 die, a PA2 die, a PA3 die, and a PA4 die. The PA1 die, the PA2 die, the PA3 die, and the PA4 die each may be integrated with two cascaded PAs. Corresponding terminals of the PA1 die, the PA2 die, the PA3 die, and the PA4 die are respectively connected to pins of the power amplifier chip 11 by using jumpers, embedded wires, or switches. The power amplifier chip 11 further includes a capacitor C1, a capacitor C2, a switch K1, a switch K2, and a switch K3. Different from the power amplifier chip 11 shown in FIG. 2 to FIG. 8, the power amplifier chip 11 shown in this embodiment of this application further includes a controller CR. Control terminals of the switch K1, the switch K2, and the switch K3 control switching-on or switching-off by using the controller CR. In addition, functions and beneficial effects of the capacitor C1, the capacitor C2, the switch K1, the switch K2, and the switch K3 and connection relationships between them and other components are the same as those of the power amplifier chip 11 shown in FIG. 5 to FIG. 8. For details, refer to related descriptions of the power amplifier chip 11 shown in FIG. 5 to FIG. 8. Details are not described herein again. For functions of the controller CR and connection relationships between the controller CR and other components, refer to the following descriptions.

Similar to the PA1 die shown in FIG. 5, the PA1 die is configured to amplify a radio frequency signal at a first frequency band (for example, a 5G frequency band). A previous-stage PA in the PA1 die may be connected to an output terminal Vcc1 of the first power supply chip through a first power terminal V1. A next-stage PA in the PA1 die may be connected to an output terminal Vcc2 of the first power supply chip through a second power terminal V2. The PA1 die is connected to a first radio frequency signal output terminal F1 of the RFIC through a signal input terminal N1. The PA2 die is configured to amplify a radio frequency signal at a second frequency band (for example, a low frequency band in 4G). The PA3 die is configured to amplify a radio frequency signal at a third frequency band (for example, an intermediate frequency band in 4G). The PA4 die is configured to amplify a radio frequency signal at a fourth frequency band (for example, a high frequency band in 4G). Previous-stage PAs in the PA2 die, the PA3 die, and the PA4 die may be all connected to an output terminal Vcc3 of the second power supply chip through a third power terminal V3. Next-stage PAs in the PA2 die, the PA3 die, and the PA4 die may be all connected to an output terminal Vcc4 of the second power supply chip through a fourth power terminal V4. The PA2 die is connected to a second radio frequency signal output terminal F2 of the RFIC through a signal input terminal N2. The PA3 die is connected to a third radio frequency signal output terminal F3 of the RFIC through a signal input terminal N3. The PA4 die is connected to a fourth radio frequency signal output terminal F4 of the RFIC through a signal input terminal N4. For a specific operating mode of the PA1 die, refer to related description of the PA1 shown in FIG. 5. For specific operating modes of the PA2 die, the PA3 die, and the PA4 die, refer to related descriptions of the PA2 shown in FIG. 5. Details are not described herein again.

Usually, for signals at a same frequency band, communication frequency bands used in different countries or regions are slightly different. For example, for a signal at a low frequency band, a frequency band with a frequency band number LB1 in the 38101-3-g21 standard may be used in some regions, and a frequency band with a frequency band number LB2 in the 38101-3-g21 standard may be used in some regions. Based on this, to adapt to a plurality of communication frequency bands, for a power amplifier (for example, the PA1) configured to amplify signals within a same frequency band range, a plurality of output ports may be provided, and each output port is applicable to one radio frequency band. An output terminal of a PA die is connected to one of the output ports by using a switch in a switch group. In addition, the switch group further includes nodes connected to the output ports in a one-to-one correspondence, and the nodes are connected to the output ports in a one-to-one correspondence by using different radio frequency signal lines. The radio frequency signal lines configured to connect the nodes and the output ports are determined based on radio frequency bands provided by the output ports. Specifically, as shown in FIG. 9, an output terminal of the next-stage PA in the PA1 die is connected to an output port Po1 or an output port Po2 by using a switch group 1. A radio frequency signal line configured to connect one node of the switch group 1 and the output port Po1 may be a radio frequency signal line applicable to a frequency band with a frequency band number N40 in the 38101-3-g21 standard. A radio frequency signal line configured to connect another node of the switch group 1 and the output port Po2 may be a radio frequency signal line applicable to a frequency band with a frequency band number N41 in the 38101-3-g21 standard. An output terminal of a next-stage PA in the PA3 die is connected to an output port Po4, an output port Po5, or an output port Po6 by using a switch group 2. A radio frequency signal line configured to connect a first node of the switch group 2 and the output port Po4 may be a radio frequency signal line applicable to a frequency band with a frequency band number MB39 in the 38101-3-g21 standard. A radio frequency signal line configured to connect a second node of the switch group 2 and the output port Po5 may be a radio frequency signal line applicable to a frequency band with a frequency band number MB3 in the 38101-3-g21 standard. A radio frequency signal line configured to connect a third node of the switch group 2 and the output port Po6 may be a radio frequency signal line applicable to a frequency band with a frequency band number MB1 in the 38101-3-g21 standard. An output terminal of a next-stage PA in the PA4 die is connected to an output port Po7, an output port Po8, or an output port Po9 by using a switch group 3. A radio frequency signal line configured to connect a first node of the switch group 3 and the output port Po7 may be a radio frequency signal line applicable to a frequency band with a frequency band number LB8 in the 38101-3-g21 standard. A radio frequency signal line configured to connect a second node of the switch group 3 and the output port Po8 may be a radio frequency signal line applicable to a frequency band with a frequency band number LB28 in the 38101-3-g21 standard. A radio frequency signal line configured to connect a third node of the switch group 3 and the output port Po9 may be a radio frequency signal line applicable to a frequency band with a frequency band number LB20 in the 38101-3-g21 standard. It should be noted that quantities of output terminals corresponding to the PA1, the PA3, and the PA4 are merely examples. It can be understood that the PA1, the PA3, and the PA4 each may correspond to more or fewer output terminals. Correspondingly, each switch group may include more or fewer switches. In addition, the power amplifier chip 11 shown in FIG. 9 further includes an output port Po3. An output terminal of a next-stage PA in the PA2 die is connected to the output port Po3 by using a radio frequency signal line. The output port Po3 can support a radio frequency signal at a frequency band with a frequency band number MHB3 in the 38101-3-g21 standard.

Further, in FIG. 9, the controller CR is connected to a data output terminal SD of the RFIC through a data input terminal SDATA, the controller CR is connected to a clock output terminal SC of the RFIC through a clock signal terminal SCLK, and the controller CR is connected to an external battery through a battery terminal VBAT. In the power amplifier chip 11, a control terminal A1 of the controller CR is connected to a gain adjustment terminal A1 of the PA1, a control terminal A11 of the controller CR is connected to an enable terminal A11 of the PA1, a control terminal A2 of the controller CR is connected to a gain adjustment terminal A2 of the PA2, a control terminal A12 of the controller CR is connected to an enable terminal A12 of the PA2, a control terminal A3 of the controller CR is connected to a gain adjustment terminal A3 of the PA3, a control terminal A13 of the controller CR is connected to an enable terminal A13 of the PA3, a control terminal A4 of the controller CR is connected to a gain adjustment terminal A4 of the PA4, a control terminal A14 of the controller CR is connected to an enable terminal A14 of the PA4, a control terminal A5 of the controller CR is connected to a control terminal A5 of the first switch group 1, a control terminal A6 of the controller CR is connected to a control terminal A6 of the second switch group 2, a control terminal A7 of the controller CR is connected to a control terminal A3 of the third switch group 3, a control terminal A8 of the controller CR is connected to a control terminal of the switch K1, a control terminal A9 of the controller CR is connected to a control terminal of the switch K2, and a control terminal A10 of the controller CR is connected to a control terminal of the switch K3.

Specifically, the controller CR may operate based on a clock cycle provided by the clock signal terminal SCLK. The controller CR may receive data from the data input terminal SDATA based on the clock cycle provided by the clock signal terminal SCLK. The data is sent by the RFIC to the controller CR through a bus, to control an operating mode. The controller CR may parse received data, and determine, based on a parsing result, information such as a power amplifier configured to transmit a signal, a gain of the selected power amplifier, a selected communication frequency band, and a power supply mode (a APT power supply mode or an ET power supply mode) of each power amplifier. Then, based on the determined information, one or more of the PA1, the PA2, the PA3, or the PA4 are controlled to be enabled, a gain of one or more of the PA1, the PA2, the PA3, or the PA4 is adjusted, and the switch group K1, the switch group K3, or the switch group K4 is controlled to be switched on, so that the one or more PAs transmit, to a network device by using an antenna, a signal output by an output terminal.

In an example, it is assumed that the PA1 is configured to transmit a first radio frequency signal, the PA3 is configured to transmit a second radio frequency signal, the next-stage PA in the PA1 supplies power in the APT mode, the next-stage PA in the PA3 supplies power in the APT mode, the PA1 transmits signals by using the N41 frequency band in the communication protocol, and the PA3 transmits signals by using the MB39 frequency band in the communication protocol. The RFIC may transmit configuration information of the PA1 and configuration information of the PA3 to the data input terminal SDATA of the power amplifier chip 11 through a bus connected to the data output terminal SD, and then the configuration information of the PA1 and the configuration information of the PA3 are provided to the controller CR through the data input terminal SDATA. The controller CR controls enabling of the PA1 and the PA3 based on received data, adjusts gains of the PA1 and the PA3, connects an output terminal of the PA1 to the output port Po1 (assuming that the output port Po1 supports the N41 frequency band), and connects an output terminal of the PA3 to the output port Po4 (assuming that the output port Po4 supports the MB39 frequency band). In addition, the controller CR may further control all of the switch K1, the switch K2, and the switch K3 to be switched on.

The configuration information may be carried in a frame format for transmission. The frame format may include a field used to indicate a power amplifier, a field used to indicate a radio frequency band in use, a field used to indicate a power supply mode in use, and the like. In a specific scenario, more or fewer fields than those included in the foregoing frame format may be alternatively included, and are set according to a requirement in the scenario. Each field may be indicated by using a plurality of bits. For example, in the field for indicating a PA, four bits may be used, and each bit represents one PA. For example, when a radio frequency signal is transmitted by using the PA1 and the PA3, corresponding bits of the field may be set to "1010". In addition, the controller CR may further control all of the switch K1, the switch K3, and the switch K3 to be switched on.

Figure 10:
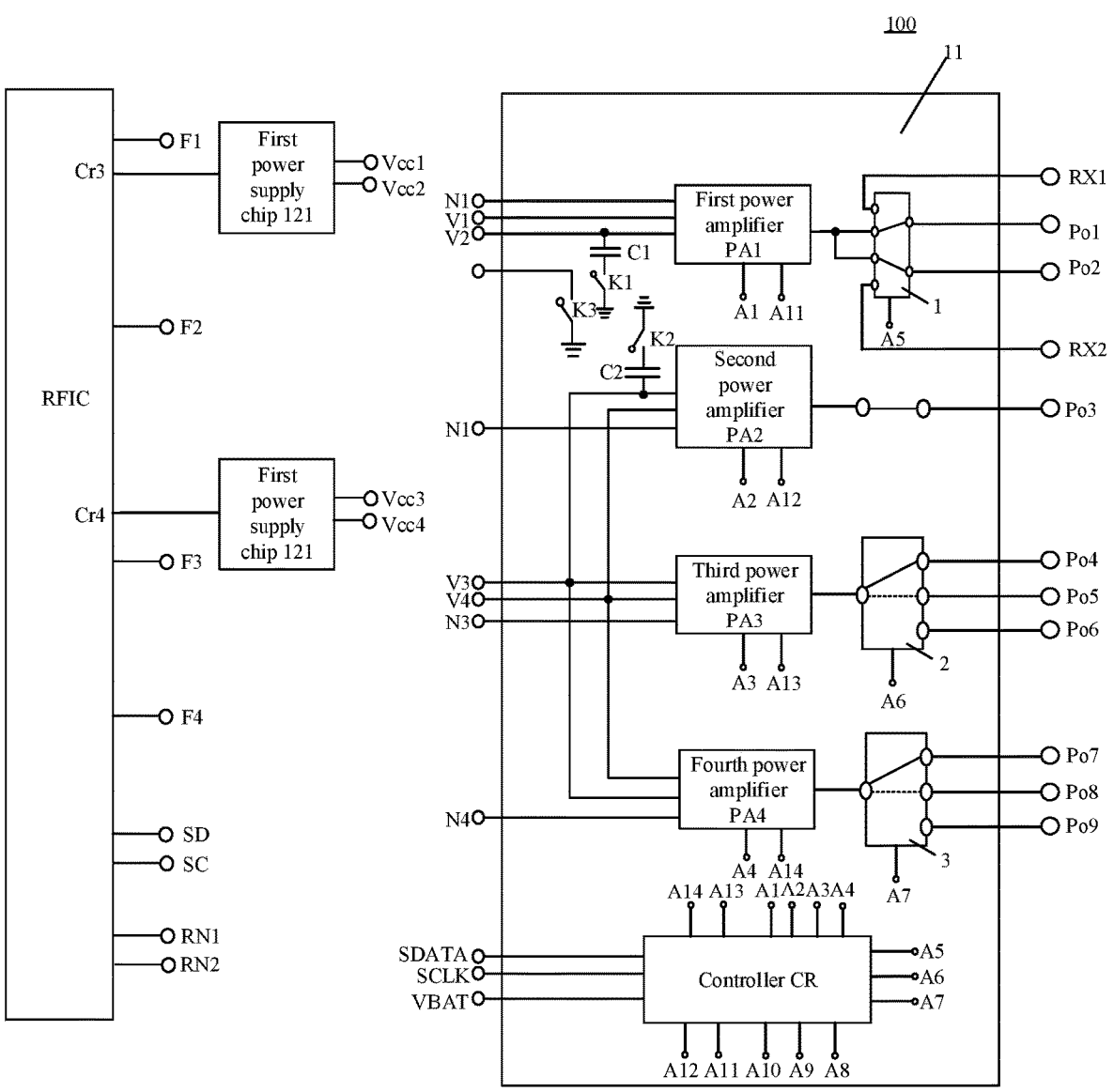
FIG. 10 is a schematic diagram of another structure of a communication device according to an embodiment of this application.

In a possible implementation of this embodiment, a terminal device may reuse an output terminal of the power amplifier chip 11 to receive a downlink signal, and then transmit the downlink signal to the RFIC through an output terminal of the power amplifier chip 11. For details, refer to FIG. 10. In FIG. 10, the power amplifier chip 11 further includes a signal receive terminal RX1 and a signal receive terminal RX2. The signal receive terminal RX1 and the signal receive terminal RX2 are respectively configured to receive radio frequency signals at different frequencies. In addition, the output port Po1 and the output port Po2 of the power amplifier chip 11 are connected to a signal receive terminal RN1 and a signal receive terminal RN2 of the RFIC respectively. The switch group 1 in the power amplifier chip 11 further includes a switch configured to connect the output port Po1 to an output terminal of the PA1 or the signal receive terminal RX1. The switch group 1 further includes a switch configured to connect the output port Po2 to an output terminal of the PA1 or the signal receive terminal RX2. The control terminal A5 of the controller CR is further configured to control a switch in the switch group 1, so that the output port Po2 is connected to the output terminal of the PA1 or the signal receive terminal RX2. Specifically, the RFIC sends, to the controller CR through the data input terminal SDATA, indication information used to indicate a transmitted signal or a received signal, and the controller CR controls a switch in the switch group 1 based on a parsing result.

It should be noted that the power amplifier chip 11 shown in FIG. 9 and FIG. 10 further includes a common ground terminal G, and all ground terminals in the power amplifier chip 11 may be connected to the common ground terminal G. The common ground terminal G may be connected to a common ground terminal of the first power supply chip, the second power supply chip, and the RFIC, so that the power amplifier chip 11, the first power supply chip, the second power supply chip, and the RFIC can have a common voltage reference signal.

Figure 11:
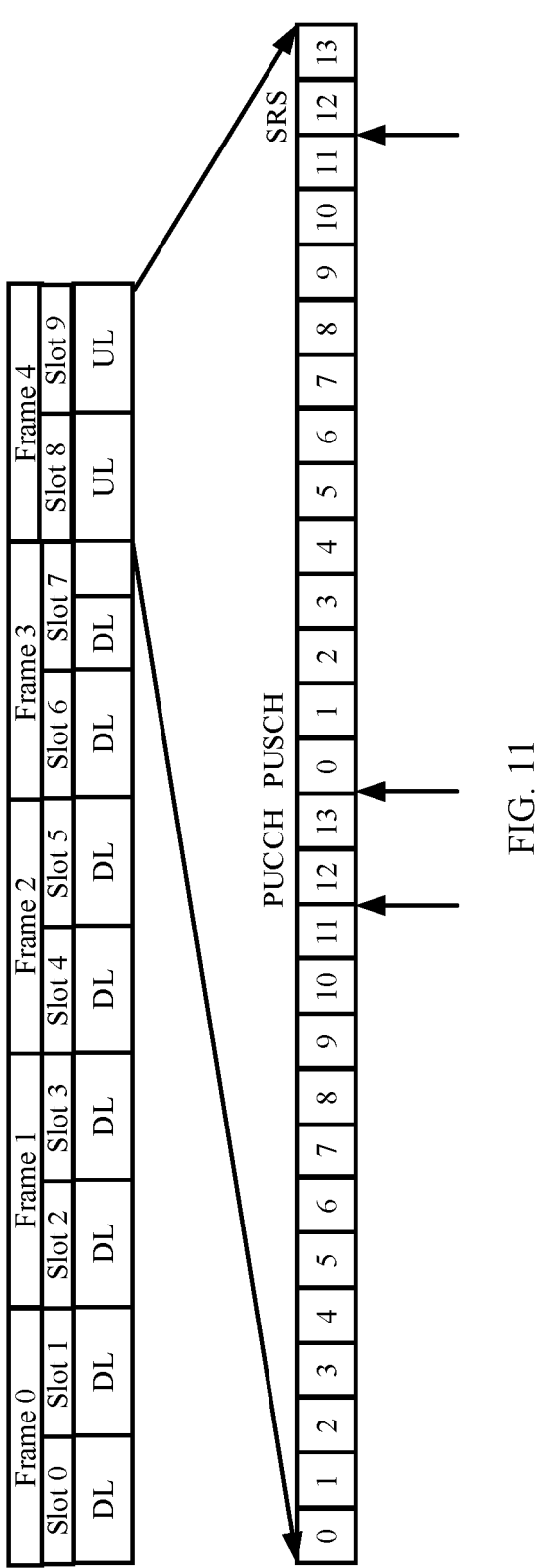
FIG. 11 is a schematic diagram of a frame format delivered by a network device according to an embodiment of this application.
Figure 12:
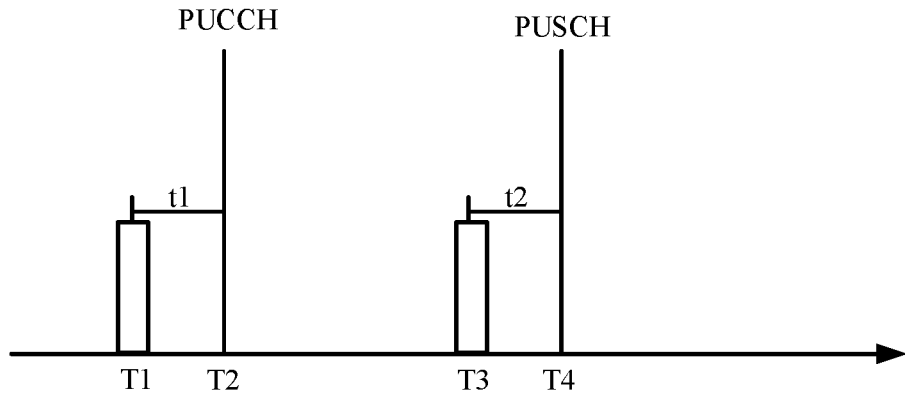
FIG. 12 is a diagram of a time sequence of times at which a gain of a power amplifier is adjusted in a conventional technology.
Figure 13:
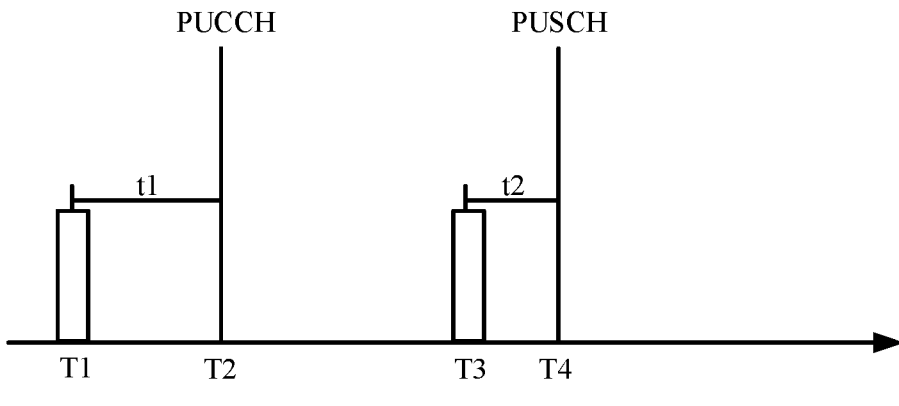
FIG. 13 is a diagram of a time sequence of times at which a gain of a power amplifier is adjusted according to an embodiment of this application.

The PA shown in embodiments of this application is applicable to various physical channels in a communication standard, that is, can amplify powers of signals transmitted in various channels. The channels may include but are not limited to a PUCCH channel, a PUSCH channel, a PRACH channel, and an SRS channel. Gains used in different channels may be different. Before the terminal device transmits a signal (in this case, the PA switches from an off state to an enabled state) or switches from signal transmission using a first-type channel (for example, a PUCCH channel) to signal transmission using a second-type channel (for example, a PUSCH channel) (in this case, the PA switches from signal transmission using a first gain to signal transmission using a second gain), the PA needs to be configured (including controlling the PA to be enabled, changing a gain of the PA, or the like). The RFIC may configure a power of the PA based on information carried in a frame format delivered by a network device, and then transmit configuration information of the PA to the controller CR. In this way, the controller CR controls the PA to be enabled and adjusts a gain of the PA, so that the PA operates normally. In a specific scenario, a communication apparatus (for example, including a baseband processor, an RFIC, and an antenna) in the terminal device may listen to measurement information sent by the network device, and then parse received measurement information and determine, based on a parsing result, information such as a frame format used to carry data during data transmission with the network device, a time at which each type of data is transmitted, and a channel used for data transmission. FIG. 11 is a schematic diagram of a frame format delivered by a network device. It can be learned from FIG. 11 that each frame of data may include two slots, and each slot may further include 14 symbols. In addition, information carried in the frame format shown in FIG. 11 further includes a start symbol for signal transmission and a specific channel used by specific symbols for signal transmission. FIG. 11 shows an example in which signal transmission starts from a symbol 12 in a slot 8. Signals are transmitted on the symbol 12 and a symbol 13 in the slot 8 through a PUCCH channel. Signals are transmitted on a symbol 0 to a symbol 11 in a slot 9 through a PUSCH channel. Signals are transmitted on a symbol 12 and a symbol 13 in the slot 9 through an SRS channel. That is, before the symbol 12 in the slot 8 starts, the PA is in the off state; and starting from the symbol 12 in the slot 8, the PA switches from the off state to the enabled state. Before the symbol 0 in the slot 9, the PA transmits signals by using the first gain; and starting from the symbol 0 in the slot 9, the PA transmits signals by using the second gain. The PA configuration information transmitted by the RFIC to the controller CR further includes a time at which the PA is to be controlled to be enabled and a time at which the gain of the PA is to be adjusted. Usually, the PA is controlled to be enabled or the gain of the PA is adjusted at a first preset time period before signal transmission or a second preset time period before channel switching. For example, in a time sequence shown in FIG. 12, it is assumed that, starting from a moment T2, the PA transmits signals by using the first gain, and the moment T2 corresponds to a start moment of the symbol 12 in the slot 8 shown in FIG. 11; and it is assumed that, starting from a moment T3, the PA transmits signals by using the second gain, and the moment T3 corresponds to a start moment of the symbol 0 in the slot 9 shown in FIG. 11. In this case, in a conventional technology, the gain of the PA is adjusted and the PA is controlled to be enabled at a moment T1, and the gain of the PA is adjusted at the moment T2, so that the PA transmits signals by using the second gain. A time period t1 obtained by subtracting T1 from T2 is the same as or slightly different from a time period t2 obtained by subtracting T2 from T3. A difference is usually approximately 2 μs. There is a large delay in a process in which the PA switches from the off state to the enabled state. In addition, in a startup process, an output signal is usually unstable due to impact of an external factor and the like. As a result, a transmitted signal has a high bit error rate. Based on this, in this embodiment of this application, the time period t1 and the time period t2 are set to be different time periods, and a length of the time period t1 is set to be greater than a length of the time period t2, that is, the PA is started in advance. Specifically, in a time sequence shown in FIG. 13, the gain of the PA may be adjusted and the PA may be controlled to be enabled at a moment T1, and other moments are the same as those shown in FIG. 12. In this way, the PA can have sufficient time to enter a stable operating state, thereby reducing a bit error rate. In addition, an error vector magnitude (EVM) of the first symbol can be further increased.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

The invention claimed is:

1. A power amplifier chip, comprising:
a package housing, wherein the package housing comprises a packaging material;
a plurality of power amplifier dies, wherein:
the plurality of power amplifier dies respectively support different radio frequency bands;
the plurality of power amplifier dies are configured for supporting dual-connectivity or multi-connectivity;
the plurality of power amplifier dies are packaged in the packaging material; and
each of the plurality of power amplifier dies comprises at least one stage of power amplifier; and
a first switch located in the package housing, wherein the first switch is configured to connect or disconnect a first capacitor between a common ground and a power terminal of a first power amplifier die of the plurality of power amplifier dies, wherein the first power amplifier die comprises the power terminal of the first power amplifier die, and a second power amplifier die of the plurality of power amplifier dies comprises a power terminal of the second power amplifier die.

2. The power amplifier chip according to claim 1, wherein the power amplifier chip further comprises:
a second capacitor and a second switch that are located in the package housing, wherein the second switch is configured to connect or disconnect the second capacitor between a common ground and the power terminal of the second power amplifier die of the plurality of power amplifier dies.

3. The power amplifier chip according to claim 1, wherein the power amplifier chip further comprises:
a controller located in the package housing, wherein the controller is configured to:

receive, from a radio frequency integrated circuit, indication information indicating a power amplifier configuration;
control, based on the indication information, to enable at least one stage of power amplifier in at least one of the plurality of power amplifier dies; and
adjust a gain of the at least one stage of power amplifier, wherein the indication information comprises at least one of the following: the at least one stage of power amplifier, a gain of the at least one stage of power amplifier, a power supply mode of the at least one stage of power amplifier, a moment at which the at least one stage of power amplifier is started, a moment at which the gain of the at least one stage of power amplifier is adjusted, or an output port in use of the power amplifier chip.

4. The power amplifier chip according to claim 1, wherein the power amplifier chip further comprises:
a plurality of switch groups located in the package housing, wherein a first switch group of the plurality of switch groups comprises a first input terminal and a plurality of output terminals; and
an output terminal of a third power amplifier die of the plurality of power amplifier dies is connected to a first input terminal of at least one switch group of the plurality of switch groups, and a plurality of output terminals of each of the at least one switch group are connected to at least a subset of a plurality of output ports of the power amplifier chip.

5. The power amplifier chip according to claim 4, wherein:
a second switch group of the at least one switch group comprises a second input terminal;
the second input terminal is connected to a radio frequency signal receive terminal of the power amplifier chip; and
a switch in the second switch group connects the radio frequency signal receive terminal to one of a plurality of output terminals in the second switch group based on a control signal.

6. The power amplifier chip according to claim 1, wherein a first power amplifier in the at least one stage of power amplifier in each power amplifier die comprises a first gain and a second gain, wherein
a first time period between a moment at which the first power amplifier is started and a moment at which the first power amplifier starts to transmit a signal is longer than a second time period between a moment at which the first power amplifier starts to be adjusted from the first gain to the second gain and a moment at which the first power amplifier starts to transmit a signal by using the second gain.

7. A communication device, wherein the communication device comprises a power supply device and a power amplifier chip, wherein the power amplifier chip comprises:
a package housing, wherein the package housing comprises a packaging material; and
a plurality of power amplifier dies, wherein:
the plurality of power amplifier dies are packaged in the packaging material;
each of the plurality of power amplifier dies comprises at least one stage of power amplifier;
a first power supply device of the power supply device is configured to supply power to a first power amplifier die in the power amplifier chip; and a second power supply device of the power supply device is configured to supply power to a remaining power amplifier die in the power amplifier chip.

8. The communication device according to claim 7, wherein the communication device further comprises:
   a radio frequency integrated circuit configured to transmit a radio frequency signal to a power amplifier integrated in at least one of the plurality of power amplifier dies.

9. The communication device according to claim 8, wherein the power supply device is further configured to:
   receive an indication signal from the radio frequency integrated circuit; and
   supply power to the power amplifier based on the indication signal in a power supply mode indicated by the indication signal, wherein the power supply mode comprises an average power tracker mode or an envelope tracker mode.

10. The communication device according to claim 7, wherein:
   the communication device further comprises a first capacitor; and
   the first capacitor is configured to be connected or disconnected between a common ground and a power terminal of the first power amplifier die based on control of a first switch.

11. The communication device according to claim 7, wherein the plurality of power amplifier dies respectively support different radio frequency bands.

12. The communication device according to claim 7, wherein the power amplifier chip further comprises:
   a first switch located in the package housing, wherein the first switch is configured to connect or disconnect a first capacitor between a common ground and a power terminal of a first power amplifier die of the plurality of power amplifier dies.

13. The communication device according to claim 7, wherein the power amplifier chip further comprises:
   a second capacitor and a second switch that are located in the package housing, wherein the second switch is configured to connect or disconnect the second capacitor between a common ground and a power terminal of a second power amplifier die of the plurality of power amplifier dies.

14. The communication device according to claim 7, wherein the power amplifier chip further comprises:
   a controller located in the package housing, wherein the controller is configured to:
      receive, from a radio frequency integrated circuit, indication information indicating a power amplifier configuration,
      control, based on the indication information, to enable at least one stage of power amplifier in at least one of the plurality of power amplifier dies; and
      adjust a gain of the at least one stage of power amplifier, wherein the indication information comprises at least one of the following: the at least one stage of power amplifier, a gain of the at least one stage of power amplifier, a power supply mode of the at least one stage of power amplifier, a moment at which the at least one stage of power amplifier is started, a moment at which the gain of the at least one stage of power amplifier is adjusted, or an output port in use of the power amplifier chip.

15. The communication device according to claim 7, wherein the power amplifier chip further comprises:
   a plurality of switch groups located in the package housing, wherein a first switch group of the plurality of switch groups comprises a first input terminal and a plurality of output terminals; and
   an output terminal of a third power amplifier die of the plurality of power amplifier dies is connected to a first input terminal of at least one switch group of the plurality of switch groups, and a plurality of output terminals of each of the at least one switch group are connected to at least a subset of a plurality of output ports of the power amplifier chip.

16. The communication device according to claim 15, wherein:
   a second switch group of the at least one switch group comprises a second input terminal;
   the second input terminal is connected to a radio frequency signal receive terminal of the power amplifier chip; and
   a switch in the second switch group connects the radio frequency signal receive terminal to one of a plurality of output terminals in the second switch group based on a control signal.

17. The communication device according to claim 7, wherein a first power amplifier in the at least one stage of power amplifier in each power amplifier die comprises a first gain and a second gain, wherein
   a first time period between a moment at which the first power amplifier is started and a moment at which the first power amplifier starts to transmit a signal is longer than a second time period between a moment at which the first power amplifier starts to be adjusted from the first gain to the second gain and a moment at which the first power amplifier starts to transmit a signal by using the second gain.

18. The power amplifier chip according to claim 1, wherein a first terminal of the first switch is connected to an electrode of the first capacitor, and a second terminal of the first switch is connected to the common ground.

19. The communication device according to claim 12, wherein a first terminal of the first switch is connected to an electrode of the first capacitor, and a second terminal of the first switch is connected to the common ground.

\* \* \* \* \*